(12) United States Patent
Wilhelmsson et al.

(10) Patent No.: US 6,353,647 B1
(45) Date of Patent: Mar. 5, 2002

(54) PHASE LOCKED LOOP

(75) Inventors: Mats Wilhelmsson, Hägersten; Peter Lundh, Skärholmen; Clarence Fransson, Älvsjö; Anders Bjenne, Huddinge, all of (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/062,436

(22) Filed: Apr. 17, 1998

Related U.S. Application Data

(63) Continuation of application No. PCT/SE96/01120, filed on Sep. 9, 1996.

(30) Foreign Application Priority Data

Oct. 20, 1995 (SE) .............................................. 9503702

(51) Int. Cl.[7] .................................................. H03D 3/24
(52) U.S. Cl. ...................................... 375/376; 327/156
(58) Field of Search ................................. 375/354, 373, 375/375, 376; 370/290, 291, 503; 331/17; 327/156

(56) References Cited

U.S. PATENT DOCUMENTS

| | | | | |
|---|---|---|---|---|
| 3,787,645 A | * | 1/1974 | Ochiai et al. ............... | 379/410 |
| 3,789,165 A | | 1/1974 | Campanella et al. ........ | 379/411 |
| 4,074,207 A | | 2/1978 | Forsberg ..................... | 331/1 A |
| 4,115,745 A | | 9/1978 | Egan .......................... | 331/17 |
| 4,129,753 A | | 12/1978 | Duttweiler .................. | 379/410 |
| 4,405,840 A | | 9/1983 | Zebo .......................... | 379/411 |
| 4,419,633 A | | 12/1983 | Phillips ....................... | 331/17 |
| 4,457,639 A | | 7/1984 | Nagai ......................... | 400/322 |
| 4,491,701 A | | 1/1985 | Duttweiler et al. ......... | 708/322 |
| 4,580,107 A | * | 4/1986 | Caldwell et al. ............. | 375/375 |
| 4,757,527 A | * | 7/1988 | Beniston et al. ............. | 370/290 |
| 4,903,247 A | * | 2/1990 | Van Gerwen et al. ...... | 367/135 |
| 4,929,917 A | | 5/1990 | Yokogawa et al. ......... | 331/1 A |
| 5,315,623 A | | 5/1994 | Kuo ........................... | 375/376 |
| 5,319,680 A | * | 6/1994 | Port et al. ..................... | 331/10 |
| 5,384,550 A | | 1/1995 | Henely et al. ................ | 331/17 |
| 5,428,605 A | * | 6/1995 | André ........................ | 370/290 |
| 5,477,535 A | | 12/1995 | Lähdemäki .................. | 370/291 |
| 5,648,964 A | * | 7/1997 | Inagaki et al. ............... | 370/228 |

FOREIGN PATENT DOCUMENTS

| | | |
|---|---|---|
| EP | 0 575 713 | 12/1993 |
| EP | 0 590 323 | 4/1994 |
| JP | 63263827 | 10/1988 |

OTHER PUBLICATIONS

Ochiai, Kazuo et al., "Echo Canceler with Two Echo Path Models", IEEE Transactions on Communications, v25, n6, pp. 589–594, 1977.*

* cited by examiner

*Primary Examiner*—Stephen Chin
*Assistant Examiner*—Chieh M. Fan
(74) *Attorney, Agent, or Firm*—Burns, Doane, Swecker & Mathis, L.L.P.

(57) ABSTRACT

A phase-locked loop having very fast acquisition, and low output phase jitter and stability at steady-state is provided. In general, the phase-locked loop is used for synchronizing an output signal of said phase-locked loop with an input reference signal. The filter circuit of the phase-locked loop includes a differentiator responsive to the phase difference representing signal from a phase detector in the PLL for providing a differentiated signal, and a filter responsive to both the phase difference representing signal and the differentiated signal to provide a filter output signal. Preferably, the filter is a low-pass filter. The output signal source of the PLL is controlled by a control signal which is generally based on the filter output signal.

31 Claims, 14 Drawing Sheets

PHASE LOCKED LOOP

This application is a continuation of International Application No. PCT/SE96/01120, which was on Sep. 9, 1996, which designated the United States, and which is expressly incorporated here by reference.

TECHNICAL FIELD

The present invention generally relates to phase-locked loop technology.

BACKGROUND

The phase-locked loop (PLL) was introduced as far back as 1932 by H. de Bellescizi, at that time for synchronous reception of radio signals. Today, the phase-locked loop is found in numerous applications of all modern technologies. It is widely used in all areas of electronics and in different fields of communication.

A phase-locked loop is, in general, a circuit for synchronizing an output signal of the loop with an input reference signal in frequency as well as in phase. It basically consists of the following functional components: an output signal source, a phase detector responsive to the output signal and the reference signal for providing a phase difference representing signal, and a filter circuit which filters the phase difference representing signal. In the synchronized state, also referred to as the locked state or steady state, the phase difference between the loop output signal and the input reference signal is zero, or at least very small, and no frequency offset between the signals exist. If a phase difference builds up, e.g. due to a frequency offset between the loop output signal and the reference signal, or if there is an instantaneous phase jump, a control mechanism in the PLL strives to eliminate the frequency offset and to reduce the phase difference to a minimum. The time required to enter the locked state is called the acquistion time.

The performance evaluation of a PLL is based on acquisition and steady state properties. It is desired to have fast acquistion and low output phase jitter at steady state. The utility of a phase-locked loop is substantially improved if the acquistion time is reduced, a fact well known in the art. The steady state mode should have high rejection of noise disturbances caused by e.g. the internal components of the PLL or environmental changes, which might alter the PLL output, in order to maintain lock of the PLL.

It is the provision of a phase-locked loop having fast acquisition and stability at steady-state to which the present invention is directed.

Many solutions have been proposed to accelerate the acquisition of phase-locked loops and to provide a stable steady state mode. In the following, techniques related to the subject matter of the present invention will be described.

In U.S. Pat. No. 4,419,633 a variable voltage controlled oscillator (VCO) with an associated phase-locked loop is disclosed. The voltage controlled oscillator arrangement comprises a constant frequency reference signal source, a variable counter for normalizing the frequency of the VCO and a coincidence detector comparing the reference frequency to the normalized output frequency and providing an error signal. Further, the VCO-arrangement includes an integrator circuit for integrating the output of the coincidence detector to provide a control signal that adjusts the VCO to change frequency, a lock detector and a fast charge circuit, including two transistors an d two bias resistors, for accelerating the charging process of the integrator circuit when the lock detect or indicates an out-of-lock condition.

U.S. Pat. No. 4,115,745 relates to a phase-lock speed-up circuit comprising a voltage controlled oscillator, a phase detector, reference frequency source and a loop filter connecting the output of the phase detector and the input of the VCO. The loop filter includes an integrator connected in series with a low-pass filter, and stabilizing resistors. Furthermore, the speed-up circuit comprises means for adding direct current to the junction between the stabilizing resistors when the oscillator is out-of-lock.

An interference resistant phase-locked loop is disclosed in U.S. Pat. No. 4,074,207. The phase-locked loop (PLL) has a voltage controlled oscillator (VCO), a phase discriminator for receiving a reference signal and a feedback signal derived from the output signal of the VCO, and a low-pass filter for filtering of the phase difference representing output signal from the discriminator. Moreover, the PLL includes a series connection of a differentiating circuit for the differentiation of the low-pass filter output signal, a limiter for limiting the output signal from the differentiating circuit, and an integrating circuit having an output which produces a control voltage for the VCO. The PLL is insensitive to large phase jumps due to the fact that the limiter is provided to take care of signal magnitudes at the output of the differentiating circuit exceeding the limiting level.

U.S. Pat. No. 4,457,639 relates to a motor control for a DC-motor printer carriage including a phase-locked loop speed control circuit. The motor control has an encoder which detects motor speed, a reference oscillator, a phase comparator for detecting the phase difference between the encoder signal and the reference oscillator output signal, and a switching circuit for voltage to be applied to the motor based upon the phase comparator output. Additionally, the motor control includes a feedback circuit having a low-pass filter for converting the phase comparator output signal into an analog speed signal, and a differentiating circuit for converting the analog speed signal into a quasi-acceleration signal. The feedback circuit effects frequency modulation of the reference oscillator output signal to bring the encoder signal and the reference signal in phase.

SUMMARY

A general objective of the present invention is the provision of a phase-locked loop (PLL) having very fast acquisition, and low output phase jitter and stability at steady-state.

In particular, when a PLL is in an out-of-lock condition (i.e. the loop output signal and the input reference signal are not synchronized) it is an object of the invention to reach the locked condition, also referred to as the steady state condition of the PLL, as fast as possible. Moreover, when the PLL is in steady state, the PLL should be able to maintain lock even though subjected to noise disturbances.

In accordance with a general inventive concept, the filter circuit of the phase-locked loop includes a differentiator responsive to the phase difference representing signal from a phase detector in the PLL for providing a differentiated signal, and a filter responsive to both the phase difference representing signal and the differentiated signal to provide a filter output signal. Preferably, the filter is a low-pass filter. In general, the output signal source is controlled by a control signal which is generally based on the filter output signal.

The filter receives a signal representative of the phase difference between the loop output signal and the reference signal, and a signal representative of the rate of change of the phase difference.

The inventive idea is to use the differentiator to speed up the "lock-in" of the filter. The phase difference representing signal contains information about the phase difference, and the differentiated signal contains information about the time-derivative of the phase difference, i.e. the frequency offset between the reference signal and the loop output signal. By using the information in both the phase difference representing signal and the differentiated signal in the regulation of the phase-locked loop a very fast lock-in is obtained. This is in contrast to prior art techniques which usually focus entirely on the phase difference representing signal. Naturally, it is desired to give the filter the output signal value which it will have at steady state as fast as possible. In accordance with the invention, the differentiator output is connected to the filter (also receiving the phase difference representing signal from the phase detector) and the differentiated signal representative of the frequency offset is pumped into the filter in order to quickly update the output signal of the filter. Thus, the differentiator is not used in the manner described in the aforementioned patents.

BRIEF DESCRIPTION OF THE DRAWINGS

The novel features believed characteristic of the inventor set forth in the appended claims. The invention itself, however, as well as other features and advantages thereof will be best understood by reference to the detailed description of the specific embodiments which follows, when read in conjunction with the accompanying drawings, wherein:

DETAILED DESCRIPTION

Figure 1:
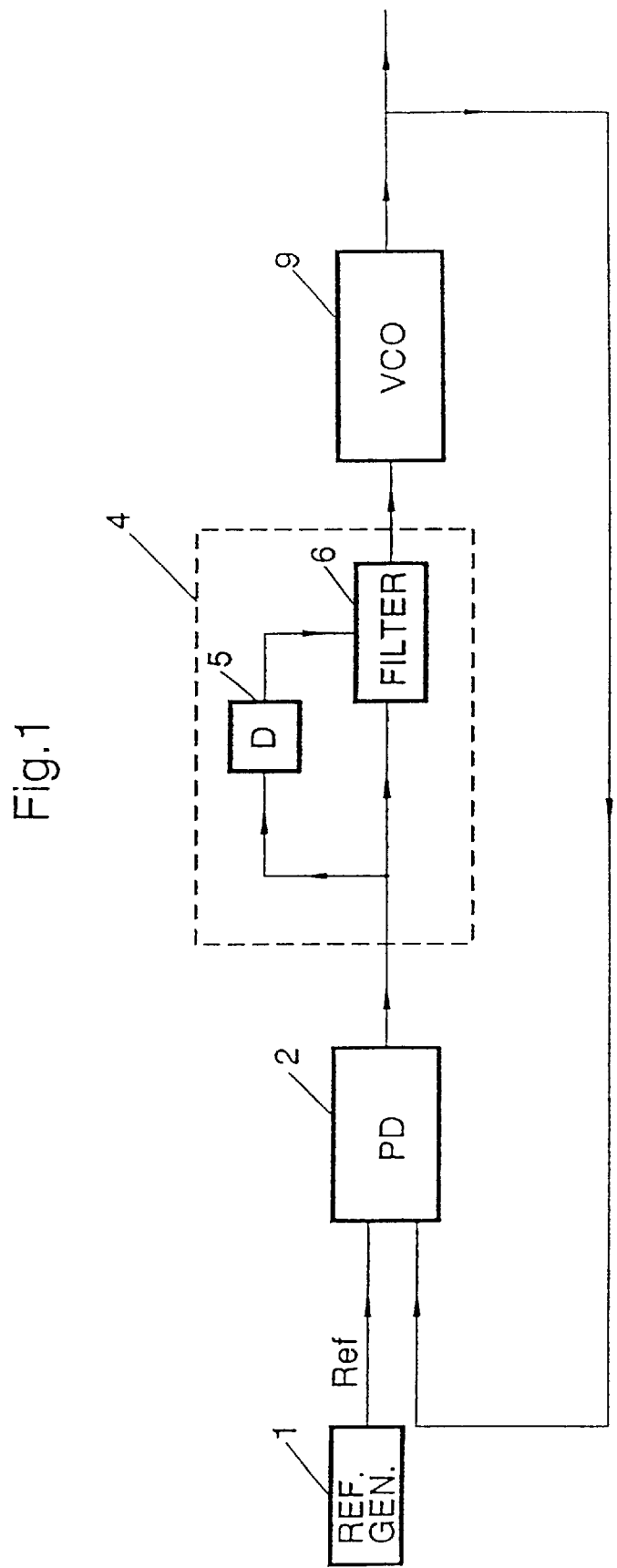
FIG. 1 is a schematic block diagram of a phase-locked loop (PLL) according to the present invention.

FIG. 1 is a schematic block diagram of a phase-locked loop (PLL) according to the present invention. It basically consists of a phase detector 2, a filter circuit 4 and an output signal source, preferably a VCO 9. The phase detector 2 is responsive to an input reference signal and an output signal of the PLL for providing an error signal representative of the phase difference between the two signals. The filter circuit 4 is responsive to the error signal from the phase detector 2 to provide a control signal which is sent to the VCO 9. The VCO 9 provides an output signal in response to the control signal, the output signal having a frequency that is determined by the control signal. Furthermore, the output signal of the VCO 9 constitutes the output signal of the phase-locked loop, but it is also fed back to the phase detector 2. The reference signal is provided to the phase detector 2 by general means 1 for generating a signal which can act as a reference signal. In general, it is assumed that initially there is a frequency offset and a phase difference between the loop output signal and the reference signal. In accordance with a general inventive concept, the filter circuit 4 includes a differentiator 5 responsive to the error signal from the phase detector 2 to provide a differentiated signal, and a filter 6, preferably a low-pass filter, which is responsive to the error signal from the phase detector 2 and the differentiated signal from the differentiator 5 to provide a (low-pass) filter output signal. It is important to understand that the filter circuit 4 should be conceived as an overall filter, which in turn includes the filter (in this case the low-pass filter 6) to be accelerated by the differentiator 5, which is also included in the filter circuit 4. The differentiated signal is representative of the rate of change of the error signal, i.e. the time-derivative or at least an approximation of the time-derivative of the error signal. In the PLL according to FIG. 1 the low-pass filter output signal is used to control the VCO 9, and hence acts as the control signal. In general, the output signal source, in this case the VCO 9, is controlled by a control signal which is generally based on the low-pass filter output signal.

A general objective of the present invention is to reduce the acquisition time of the phase-locked loop, i.e. to reduce the time required to synchronize the output signal of the loop with the reference signal in frequency as well as in phase. If a phase difference builds up, e.g. due to a difference in frequency between the output signal and the reference signal, perhaps in combination with a phase jump, the PLL acts to eliminate this frequency difference or offset, and to reduce the phase difference between the two signals to a minimum.

The idea according to the present invention is to use a differentiator to speed up the "lock-in" of a filter, advantageously a low-pass filter. It is assumed that a low-pass filter 6 is desired in the steady state configuration of the PLL. Naturally, it is desired to give the low-pass filter 6 the output signal value which it will have at steady-state as fast as possible. As pointed out above, the differentiating signal is representative of a time derivative of the phase difference, and hence representative of a time-dependent frequency offset between the reference signal and the loop output signal. Since the low-pass filter 6, in steady state, has an output signal generally proportional to the frequency of the PLL, and the differentiated signal contains information about the frequency offset, a very fast lock-in is obtained by sending the output signal from the differentiator 5 into the low-pass filter 6. In contrast to prior art solutions, the focus here is on both frequency locking and phase locking, since information about the phase difference in the error signal and information about the frequency offset in the differentiated signal are used in the regulation of the phase-locked loop. As can be seen in FIG. 1, the low-pass filter 6 receives both the error signal from the phase detector 2 and the differentiated signal from the differentiator 5.

When the output signal of the phase-locked loop is synchronized with the reference signal, there is generally no frequency offset between the two signals and the difference in phase is equal to zero, or at least very small. Consequently, the signal contribution from the differentiator 5 is also zero or very small, and hence, if desired, the differentiator 5 can be switched out of the filter circuit 4 without causing any reconfiguration transients. In general, the differentiator 5 is preferably used only during lock-in and not in steady state, unless it, for other reasons, is desired to use a differentiator 5 in the steady state configuration of the filter circuit 4.

Figure 2:
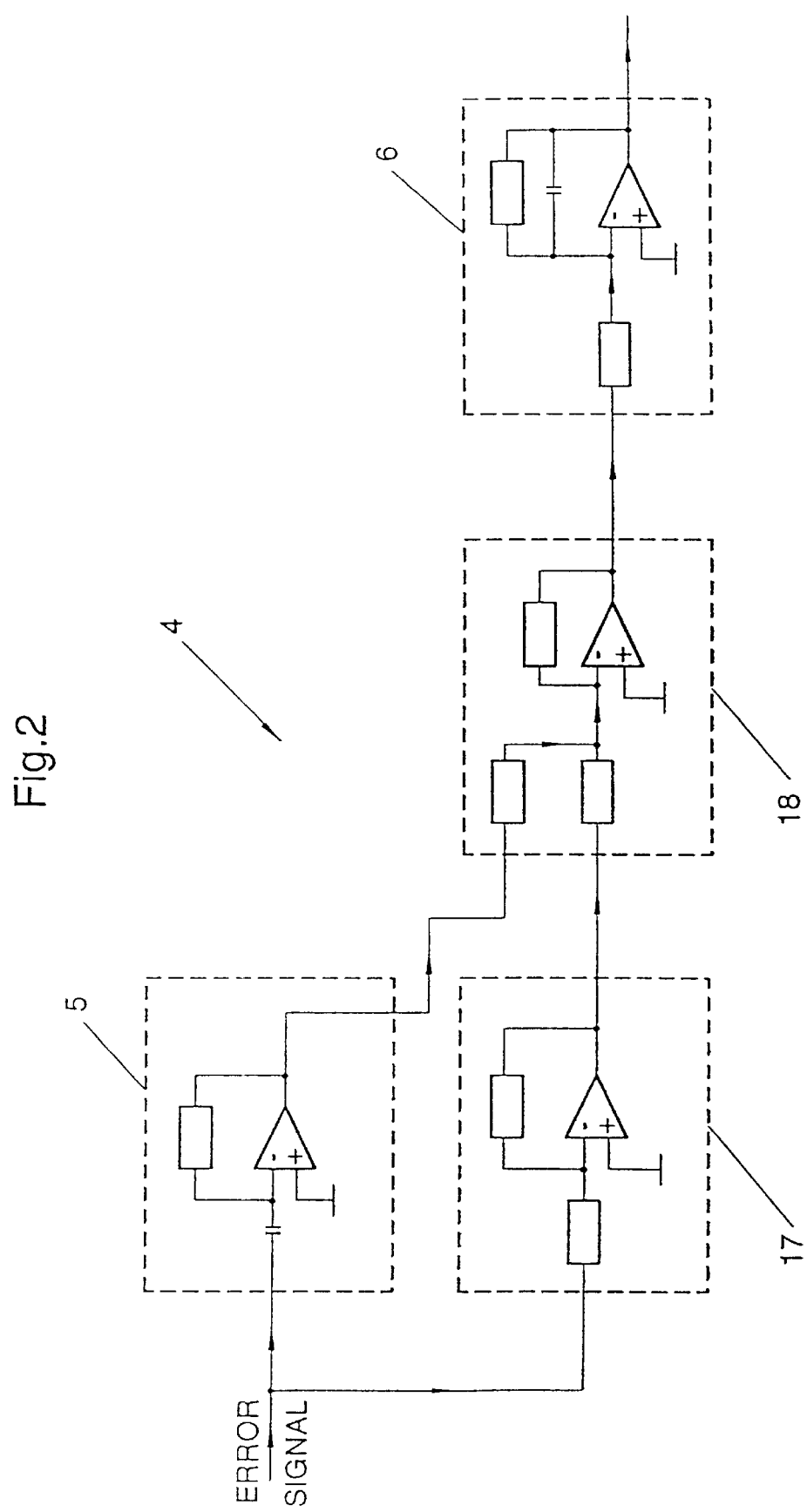
FIG. 2 is a schematic circuit diagram showing an analog filter circuit according to one embodiment of the invention in principle.

FIG. 2 is a schematic circuit diagram showing an analog filter circuit according to one embodiment of the invention in principle. The analog filter circuit 4 basically consists of operational amplifiers and conventional RC-circuits. In one embodiment, the differentiation is realized by an RC-circuit with an operational amplifier as shown in FIG. 2. Since the low-pass filter 6 only has one input in the analog application, a summator 18 is used to add the differentiated signal and the error signal. The summator 18 generally inverts the signal, and therefore the differentiator 5 is constructed such as to generate an inverted differentiated signal. For the same reason, the error signal from the phase detector is also inverted by an inverter 17. In a practical implementation, other auxiliary devices, such as temperature stabilizers, noise suppression units etc., are included in the filter circuit 4.

Figure 3:
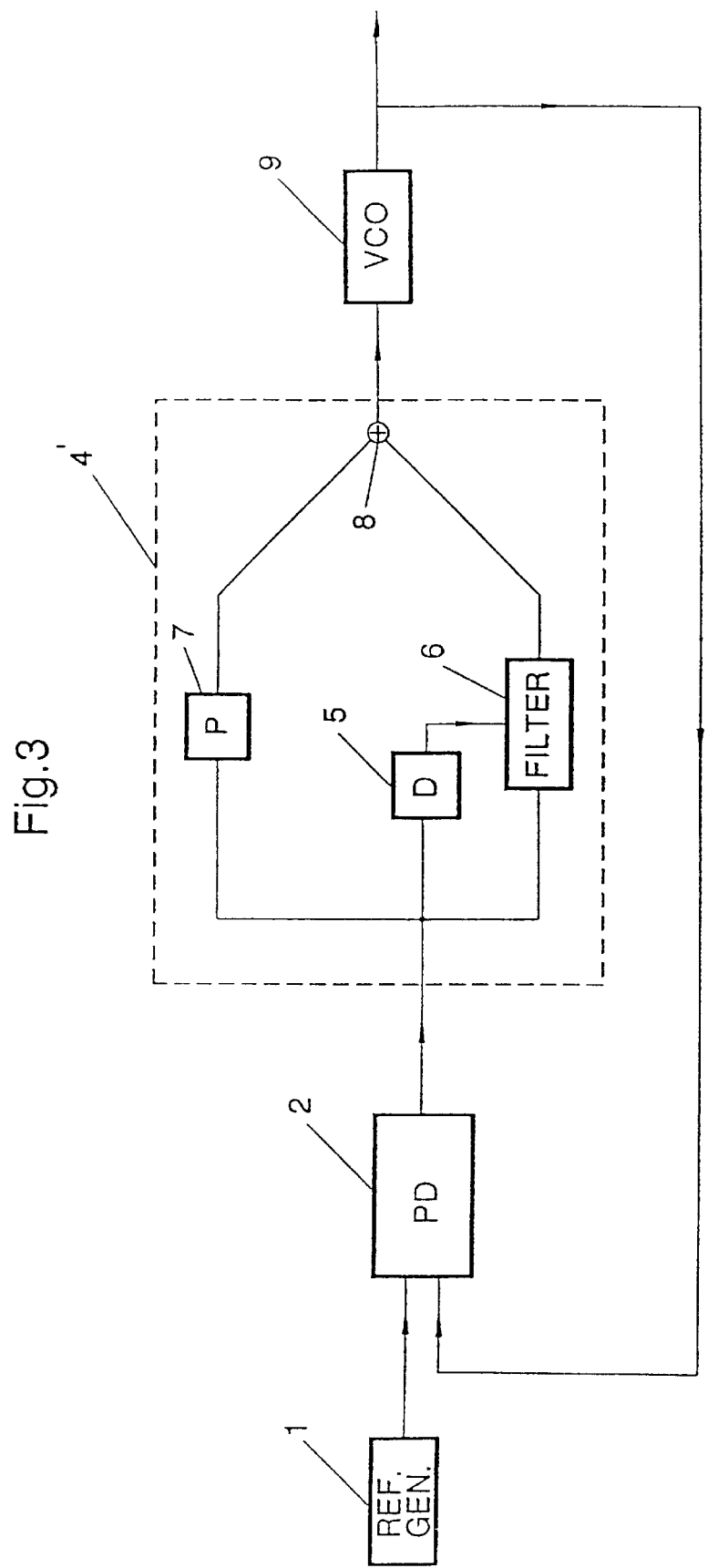
FIG. 3 is a schematic block diagram of a phase-locked loop according to the present invention.

FIG. 3 is a schematic block diagram similar to that of FIG. 1 showing a phase-locked loop according to the present invention. In addition to the differentiator 5 and the low-pass filter 6, the filter circuit 4' further comprises an amplifying block 7 which is responsive to the error signal from the phase detector 2, and a summing block 8 responsive to the output signal of the amplifying block 7 and the low-pass filter output signal. Preferably, the amplification of the amplifying block 7 is proportional. The amplifying block 7 is connected in parallel with the low-pass filter 6, and the summing block 8 receives the output signal of the amplifying block 7 and the output signal of the low-pass filter 6 to provide a control signal that is the sum of the two signals. This control signal controls the output signal source 9. In this case, the control signal is not entirely based on the low-pass filter output signal, although, in another exemplary embodiment of the invention, the main contribution to the control signal comes from the low-pass filter 6. In all other regards the phase-locked loop of FIG. 3 is identical to that of FIG. 1. This proportionally amplifying path is provided for reasons of stability. In some cases, e.g. for PLL-systems with very narrow bandwidth, it is preferable to have this filter configuration.

Figure 4:
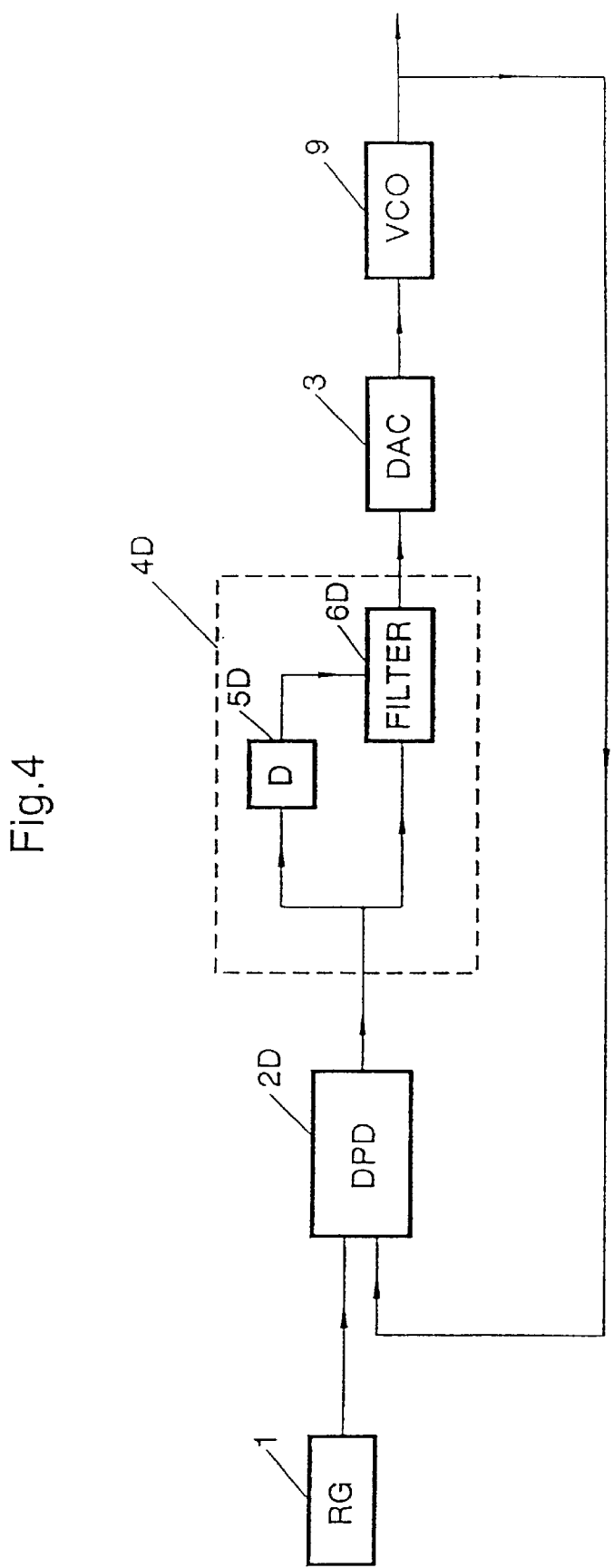
FIG. 4 is a schematic block diagram of a phase-locked loop according to the present invention.

FIG. 4 is a schematic block diagram similar to that of FIG. 1 showing a phase-locked loop according to the present invention. In this embodiment of the invention, the phase detector is a digital phase detector 2D (D for digital) for generating a digital error signal representative of a quantized phase difference between the reference signal and the loop output signal, and the filter circuit is a digital filter circuit 4D responsive to the digital error signal for generating a digital control signal. The digital filter circuit 4D comprises a digital differentiator 5D responsive to the digital error signal to provide a differentiated signal, and a digital low-pass filter 6D which is responsive to the digital error signal from the digital phase detector 2D and the differentiated signal from the differentiator 5D to provide a digital low-pass filter output signal which acts as the digital control signal. The digital differentiator 5D is preferably software based and executes in a microprocessor (not shown). In an exemplary embodiment of the invention, the differentiated signal is realized by subtracting the digital error signal value of the current sample with the digital error signal value of the preceding sample, and by dividing the result of this subtraction with the sampling time. Consequently, in this embodiment, the differentiated signal is representative of a discrete-time approximation of the time derivative of the quantized phase difference. An exemplary internal structure of the digital low-pass filter 6D will be described later with reference to FIGS. 8 and 9. Furthermore there is provided a digital-to-analog converter (DAC) 3 which converts the digital control signal into an analog control signal for controlling the output signal source, in this case the VCO 9.

The digital phase detector 2D may be any suitable standard circuit solution whatsoever known to the art, e.g. a counter-based digital phase detector. Preferably, the digital filter circuit 4D is a software-based digital filter circuit executing in a microprocessor (not shown). However, a hardware implementation, possibly in combination with software-based components, is also possible.

Of course, it is possible to use an analog filter circuit in this embodiment of the invention, instead of the digital one, and e.g. use another digital-to-analog converter for converting the digital error signal into an analog error signal which subsequently is sent to the analog filter circuit. Then the digital-to-analog converter 3 is omitted since the filter circuit output signal is analog. However, another exemplary embodiment of the invention includes a digital filter circuit as described above. A digital phase detector which quantizes (amplitude quantization) the phase difference between the reference signal and the loop output signal may give rise to quantization errors which will effect the performance of the phase-locked loop. A very small change in phase of one or both of the signals that are sent to the phase detector can lead to a significantly larger change in the phase difference representing digital error signal because of the quantizing properties of the digital phase detector. Hence, this larger change in phase difference for the digital error signal is not representative of the actual phase change, and this so-called quantization error may propagate through the system and effect the lock-in process and the steady state properties of the PLL. In order to minimize output phase jitter at steady state, and also during lock-in, caused by the propagation of quantization errors through the differentiator 5D, the signal contribution from the differentiator is gradually decreased to zero over a selectable period of time, all as will be described in more detail with reference to FIG. 5.

Figure 5:
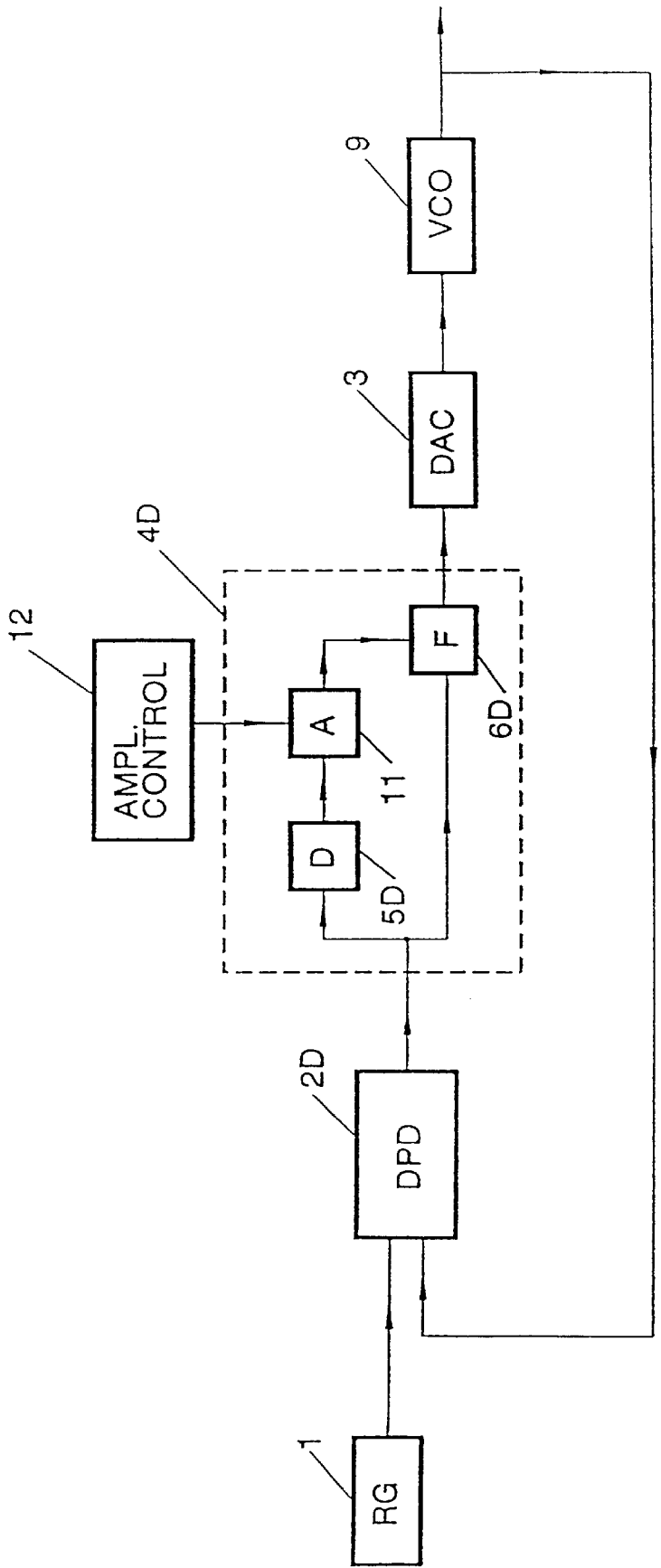
FIG. 5 is a schematic block diagram of a phase-locked loop according to the present invention.

FIG. 5 is a schematic block diagram similar to that of FIG. 4 illustrating a phase-locked loop in accordance with the invention. Preferably, the differentiated signal from the differentiator 5D is amplified by the amplifier 11 so as to further improve the acquisition properties of the PLL. Note, however, that, throughout the entire disclosure, amplifications equal to less than 1, but in general greater than zero, also are included in the expression "amplify". Furthermore, there is provided an amplification control 12 associated with the amplifier 11 so as to control the amplification thereof. Conveniently, the amplifier 11 and the amplification control 12 are software-based and executed in a microprocessor, preferably the same microprocessor that executes the digital filter circuit 4D. Primarily, the amplifier 11 and the amplification control 12 are used to amplify the differentiated signal so as to effectively reduce the acquistition time of the PLL even further. The actual amplification to be used varies from application to application, and depends on the specific components of the PLL and their respective settings. In addition, the amplifier and amplification control arrangement is utilized to handle quantization errors and configuration transients. A preferred way of gradually decreasing the signal contribution from the differentiator 5D in order to handle quantization distorsion is to use the amplification control 12 for gradually decreasing the amplification of the amplifier 11 from a first value, generally greater than 1, at the beginning of the lock-in process to zero, or at least to a very small value, at a predetermined later time. In this way the effect of quantization distorsion is minimized, and the PLL has low output phase jitter at steady state. The reason for gradually decreasing the signal contribution from the differentiator 5D, instead of changing it abruptly, is to avoid configuration transients. If configuration transients can be effectively handled by other means, then it is of course possible to abruptly decrease the amplification, or in other words to simply switch the differentiator out of the filter. In general, the differentiator is used to speed up the lock-in of the PLL, and consequently it is not used in steady state, unless required for other reasons.

Figure 6:
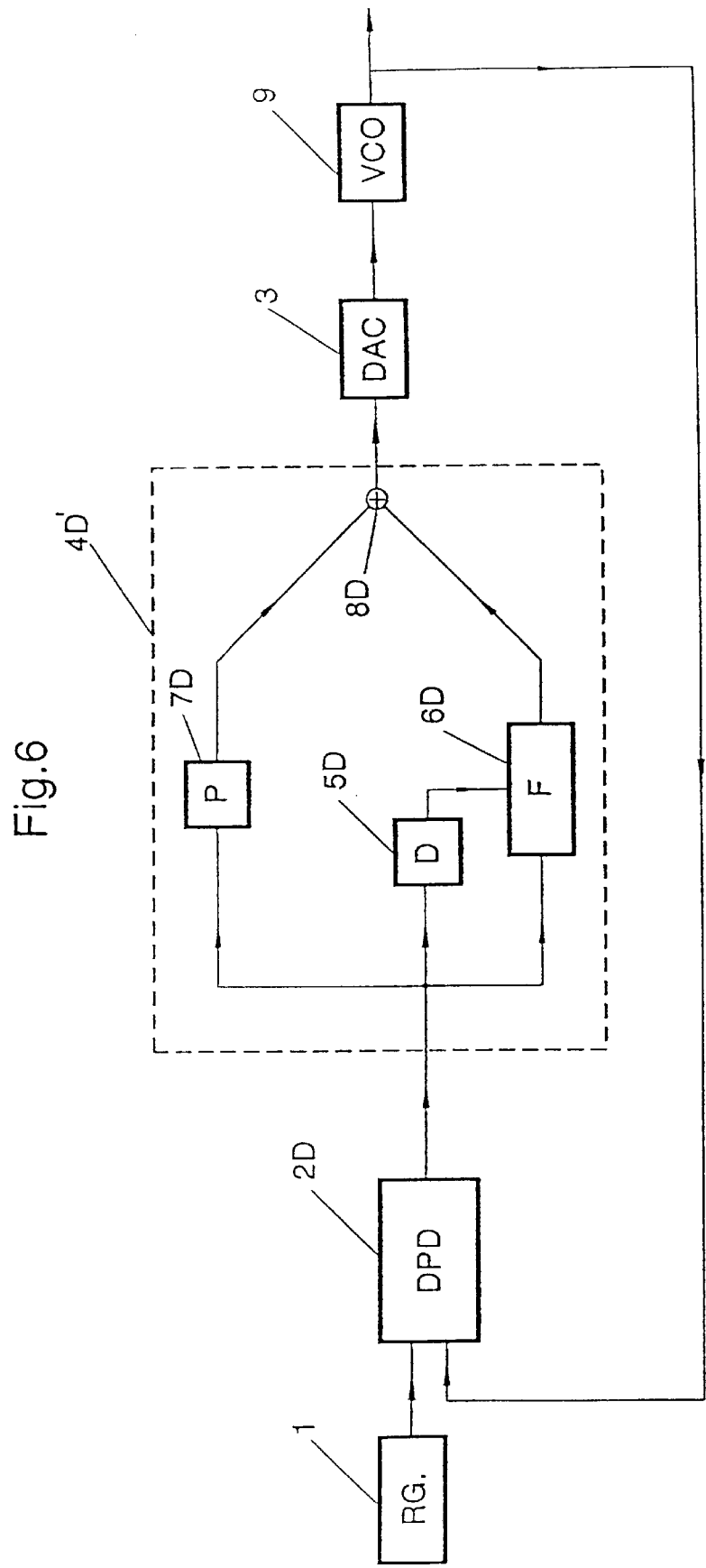
FIG. 6 is a schematic block diagram of a phase-locked loop according to the present invention.

FIG. 6 is a schematic block diagram similar to that of FIG. 4 showing a phase-locked loop according to the invention. In addition to the differentiator 5D and the digital low-pass filter 6D, the digital filter circuit 4D' further includes an amplifier 7D which is responsive to the digital error signal from the digital phase detector 2D, and a summing element 8D which adds the output signal of the amplifier 7D and the output signal of the digital low-pass filter 6D to provide the digital control signal. The amplifier 7D is connected in parallel with the digital low-pass filter 6D as can be seen in FIG. 6, and preferably, the amplifier 7D is a proportional amplifier. In all other regards, the PLL of FIG. 6 is identical to that of FIG. 4. The amplifier 7D is provided in parallel with the digital low-pass filter/differentiator arrangement for stability reasons. In one embodiment of the present invention, amplifications greater than 1 are used for the amplifier 7D. However, since quantization errors originating from the digital phase detector 2D also are amplified by the amplifier 7D, it is necessary to make a trade-off between stability and low output phase jitter by using relatively low amplification values for the amplifier 7D.

Moreover, the same arrangement 11, 12 for amplifying the differentiated signal/gradually decreasing the signal contribution from the differentiator as that of FIG. 5 is used in this embodiment of the invention although it is not illustrated in FIG. 6.

Figure 7:
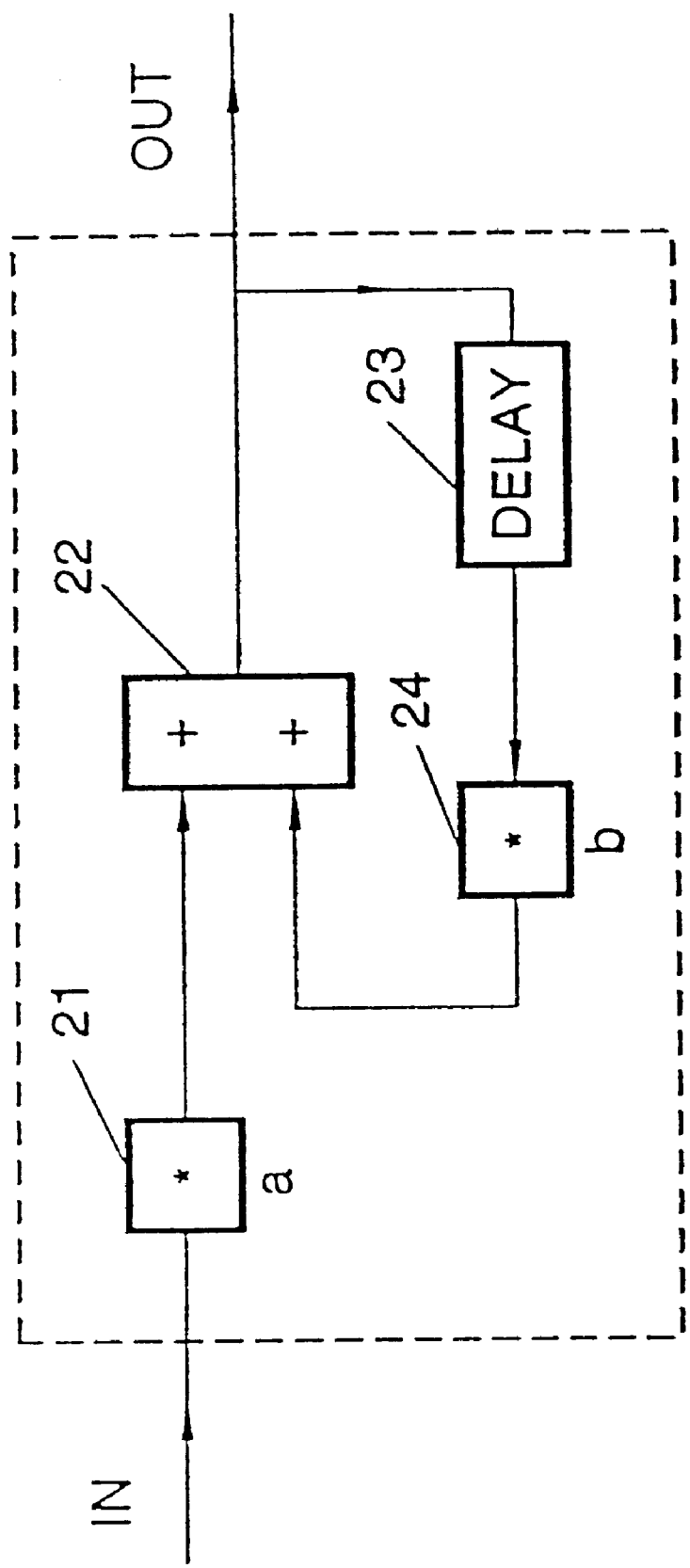
FIG. 7 shows a schematic conventional representation of a prior art digital low-pass filter.

With reference to FIG. 7 there is shown a schematic conventional representation of a prior art digital low-pass filter. A digital low-pass filter is generally responsive to an input signal IN for generating an output signal OUT. A conventional digital low-pass filter basically consists of the following functional blocks:

an amplifier 21 (with amplification a) responsive to the input signal IN for providing a first amplified signal,
a summing block 22 responsive to the first amplified signal and an amplified delayed internal feedback signal of said digital low-pass filter for adding the two signals to provide the output signal OUT of said digital low-pass filter, also acting as an internal feedback signal,
a delay unit 23 for delaying the internal feedback signal, and
a second amplifier 24 (with amplification b) responsive to the delayed internal feedback signal for amplifying the delayed internal feedback signal to provide the amplified delayed internal feedback signal to the summing block 22.

At this point it is convenient to introduce some formulas for the digital low-pass filter. First of all, the amplification b must lie in the interval 0<b<1. By considering a normalized low-pass filter and making approximations using Taylor series and/or simple mathematical assumptions it is possible to identify the DC-gain, $K_{1p}$, and the 3 dB cut-off frequency, $\omega_c$, of the digital low-pass filter as:

$$K_{1p} = \frac{a}{1-b} \tag{1}$$

and $$\omega_c = \frac{2}{T_s} \frac{1-b}{1+b}, \tag{2}$$

where $T_s$ is the sampling time, a and b are the respective amplifications mentioned above. The latter of the approximative expressions above is valid when $T_s \cdot \omega_c$ is small and b is almost 1.

Figure 8:
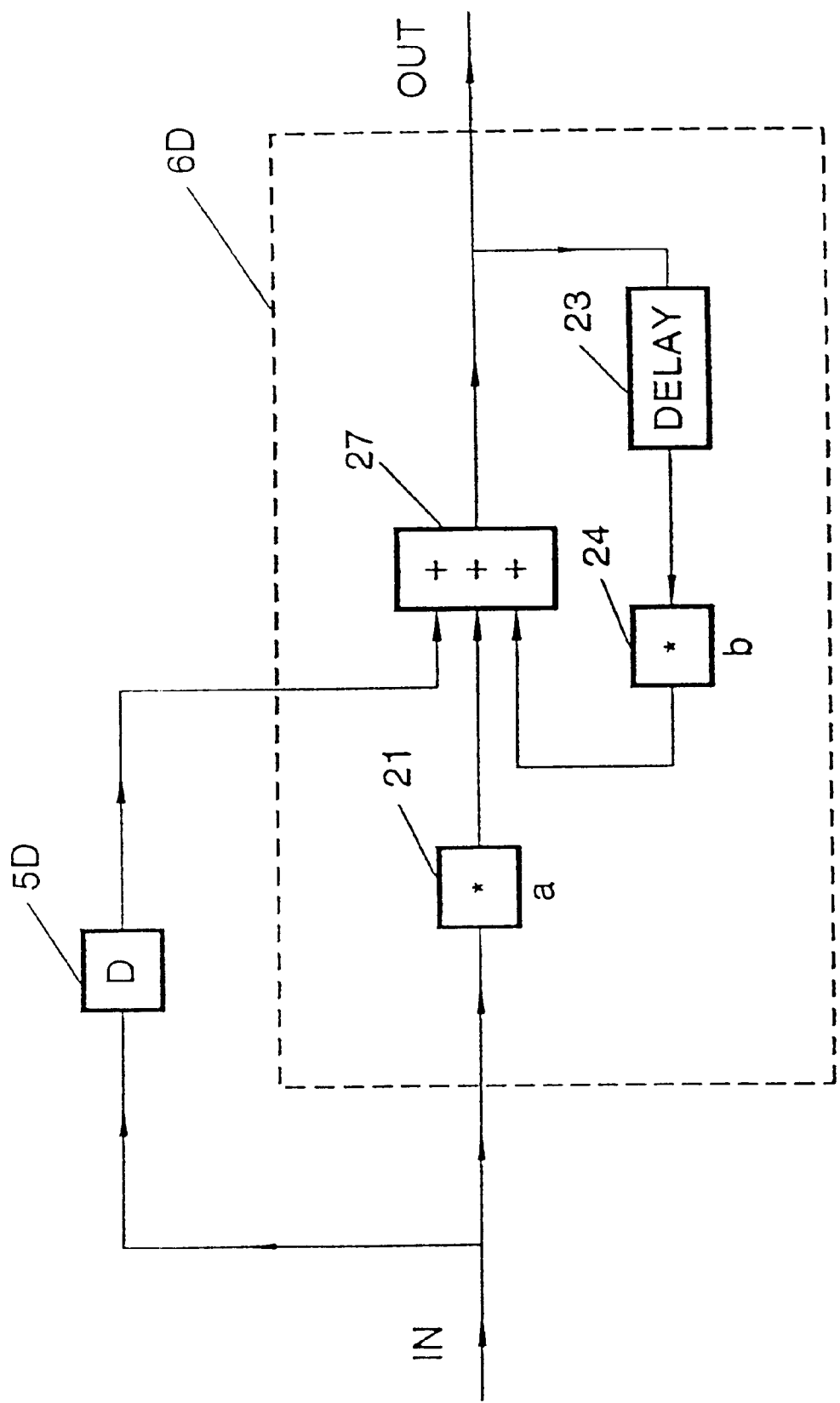
FIG. 8 shows a schematic block diagram of a digital filter circuit in accordance with the present invention in more detail.

With reference now to FIG. 8 there is shown a schematic block diagram of a digital filter circuit in accordance with the present invention in more detail. The filter circuit basically includes a differentiator 5D and a digital low-pass filter 6D.

The differentiator 5D is responsive to a signal IN, which is the digital error signal from the digital phase detector 2D (not shown in this figure) and produces a differentiated signal. The digital low-pass filter 6D is responsive to both the signal IN, i.e. the digital error signal, and the differentiated signals. The digital low-pass filter 6D according to the invention is identical to that of FIG. 7, except for the summing block 27 which differs from the summing block 22. The summing block 27 is responsive to the differentiated signal from the differentiator 5D, the first amplified signal from the amplifier 21 and the amplified delayed internal feedback signal from the second amplifier 24. Hence, the summing block 27 receives these three signals, and adds them together to produce the output signal of the digital low-pass filter 6D. In this way, the differentiated signal is pumped into the digital low-pass filter 6D. The differentiated signal which contains information about the frequency offset between the reference signal and the output signal of the PLL directly effects the output signal of the digital low-pass filter 6D, said digital low-pass filter output signal constituting the basis of the digital control signal which, after digital-to-analog conversion, controls the frequency of the output signal of the VCO 9 (not shown in this figure). Preferably, the amplifier 11 and the amplification control 12 of FIG. 5 are included in this embodiment of the invention, although they are not illustrated in FIG. 8. Of course, there are other ways of applying the differentiated signal to the digital low-pass filter 6D such that the differentiated signal contributes to the output signal of the digital low-pass filter 6D.

By appropriately setting the amplification of the amplifier 11 and the amplifier 21, the focus of the regulation of the PLL can be turned more to either frequency locking or phase locking. If, e.g. it is desired to focus mostly on frequency locking at the very beginning of the lock-in, then the amplification of the amplifier 11 is set to a relatively large value at this period of time, whereas the amplification of the amplifier 21 is set to a relatively low value. If on the other hand, it is desired to focus more on phase locking, then it is either possible to increase the amplification of the amplifier 21, or to decrease the amplification of the amplifier 11, or a combination thereof. It has turned out to be advantageous to focus mostly on the frequency locking at the very beginning of the lock-in. In this way, the frequency offset is eliminated almost instantly. Then the focus is turned to phase locking, and the phase difference is reduced to a minimum. Therefore, the amplification of the amplifier 11 is decreased to zero in a rather short period of time, only a few samples in the microprocessor implementation. A strong frequency lock generally contradicts the ability to obtain phase lock, since the PLL-system must be able to change its frequency to get a phase lock. This is the reason for shifting the focus of the PLL-regulation from frequency locking to phase locking in the manner described. It is important to understand that this amplification setting is possible to combine with the gradual decrease of the amplification of the amplifier 11 described above.

Figure 9:
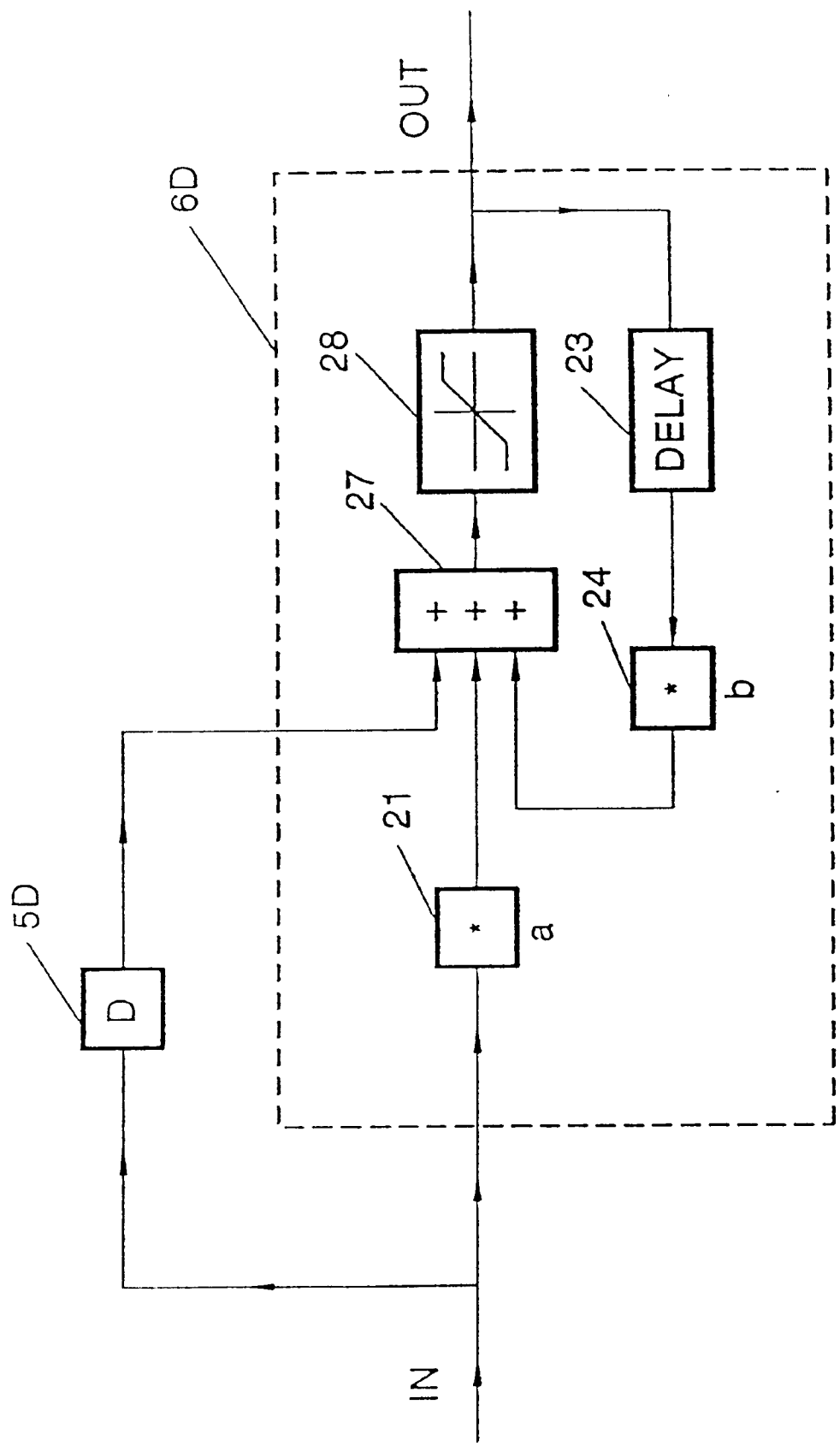
FIG. 9 is a schematic block diagram showing a digital filter circuit according to the invention.

FIG. 9 is a schematic block diagram similar to that of FIG. 8 showing a digital filter circuit according to the invention, which basically comprises a differentiator 5D and a digital low-pass filter 6D. In addition to the components described in connection with FIG. 8, the digital low-pass filter 6D further includes a limiter 28 for limiting the output signal of the digital low-pass filter 6D, as well as the internal feedback signal of the digital low-pass filter 6D. If the digital low-pass filter 6D is software based and executes in a microprocessor, it is technically possible to have a digital low-pass filter output variable which corresponds to a voltage far beyond the operating range of the digital-to-analog converter 3 (not shown in this figure). If this is the case, then the DAC 3 will be saturated in either direction. If e.g. the output signal from the digital low-pass filter corresponds to a voltage of 2.6 V, and the operating range of the DAC 3 extends from –2 V to +2 V, the DAC 3 can only make use of 2 of the 2.6 V. Accordingly, instead of letting the relatively slow dynamic behaviour of the digital low-pass filter finally reduce the signal value of the output signal, as well as the signal value of the internal feedback signal, these signals are limited by the limiter 28 to both lie within the predetermined range; the operating range of the DAC 3 or a portion thereof. This limiting action is generally effectuated instantly. It is important that the limiter 28 is provided in the digital low-pass filter 6D such that the internal feedback signal also is limited by the limiter 28. Otherwise, a signal value that is too large will continue to live in the digital low-pass filter 6D because of the internal feedback signal. The above described way of limiting the output signal as well as the internal feedback signal of a digital filter can be applied to any suitable digital filter known to the art, with or without having a differentiator connected to the filter.

Figure 10:
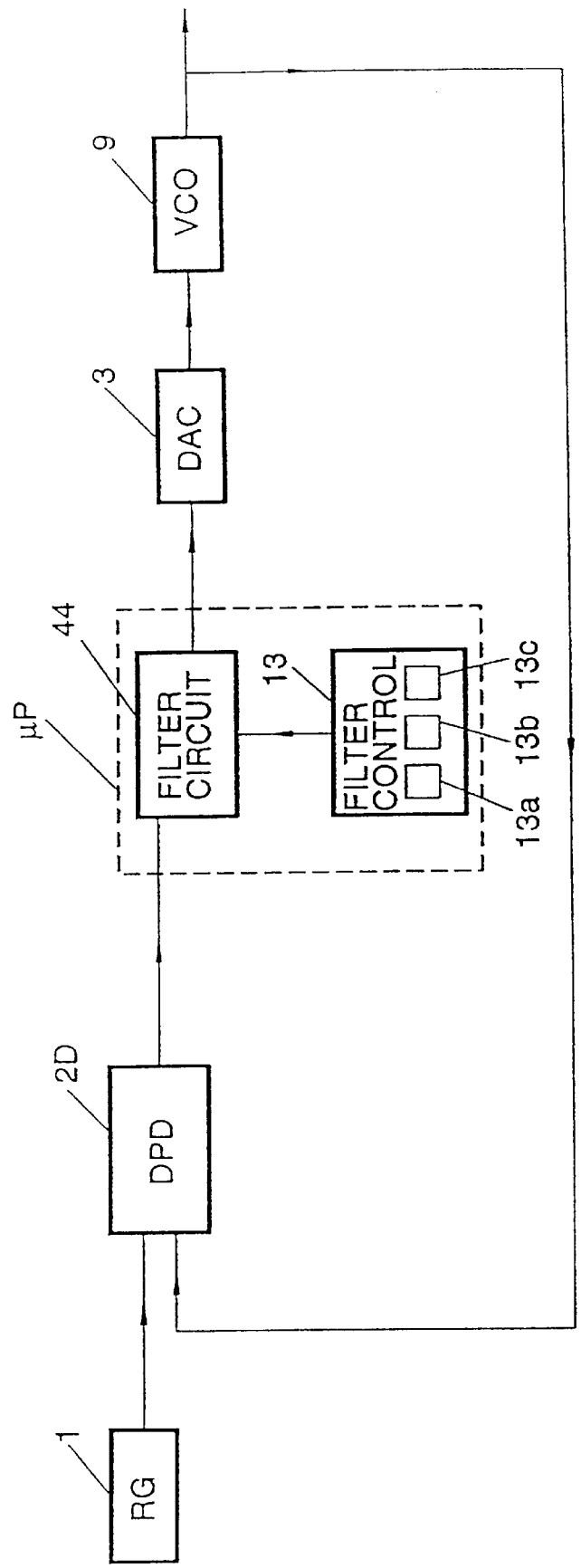
FIG. 10 is a schematic block diagram of a phase-locked loop according to the present invention.

FIG. 10 is a schematic block diagram similar to that of FIG. 4 showing a phase-locked loop in accordance with the invention. The phase-locked loop basically consists of a digital phase detector 2D, a digital filter circuit 44, a digital-to-analog converter 3, and an output signal source, preferably a VCO 9. There is also general means 1 for providing a reference signal. Said general means 1 is, as an example, a telecommunication switch which generates a clock signal that acts as a reference signal for the PLL. The digital filter circuit 44 is any one of the digital filter circuits 4D and 4D'. Furthermore, the PLL includes a filter control (filter circuit control) 13 for controlling the digital filter circuit 44. In all other regards, the PLL of FIG. 10 is identical to that of FIG. 4. Preferably, the digital filter circuit 44 and the filter control 13 are both software based, executing in a microprocessor µP. Alternatively, they are realized by a combined hardware and software implementation. The filter control 13 controls the characteristics of the digital filter circuit 44. It has turned out that by having a relatively large value for the DC-gain of the digital low-pass filter 6D at the beginning of the lock-in, the acquisition time is further reduced. In one embodiment of the invention, the DC-gain at the beginning of the lock-in is up to 25 times greater than the final DC-gain at some predetermined time later. In accordance with one embodiment of the invention, the DC-gain of the low-pass filter 6D in the digital filter circuit 44 is gradually decreased from a relatively large value at the beginning of the lock-in process of the PLL to the final value which the digital low-pass filter 6D should have in steady state over a selectable period of time. Advantageously, the gradual decrease of the DC-gain is realized by the filter control 13. Note, that the process of gradually decreasing the DC-gain can be applied to any standard digital filter circuit including a filter, e.g. a low-pass filter, with or without a differentiator connected to the filter, and the acquisition time of the PLL will still be reduced in comparison to prior art solutions. However, an exemplary embodiment of the invention utilizes the differentiator 5D to speed up the digital low-pass filter 6D in combination with a gradual decrease of the DC-gain of the digital low-pass filter 6D from a rather large value to a predetermined smaller value. In this way, a very fast acquisition is obtained.

Some improvement in the characteristics of a PLL has been obtained in the prior art, see e.g. U.S. Pat. No. 5,315,623, by providing a loop filter with selectable time constant, by using switched resistance in the filter. More specifically, according to prior art teachings, the time constant is reduced (i.e. the loop filter bandwidth is increased) during lock-in and the time constant is increased (i.e. the loop filter bandwidth is reduced) at steady state.

In accordance with one embodiment of the invention, the differentiator 5D is used to speed up the lock-in of the digital low-pass filter 6D in combination with a gradual decrease of the cut-off frequency of the digital low-pass filter 6D in the digital filter circuit 44 from a relatively large value at the beginning of the lock-in to a predetermined smaller value over a selectable period of time. The gradual decrease of the cut-off frequency of the digital low-pass filter 6D is effectuated by the filter control 13. Preferably, the cut-off frequency of the digital low-pass filter 6D has a very low value at steady state so as to minimize phase jitter. In addition, the cut-off frequency in a digital modell should be rather low at steady state for stability reasons. The acquisition time for a PLL which utilizes both the differentiator/low-pass filter arrangement of the invention and the gradual decrease of the cut-off frequency of the low-pass filter is generally only about 50% (when the initial frequency offset is very large, the acquisition time is reduced up to 25 times) of the acquisition time for a PLL which utilizes the gradual decrease of the cut-off frequency, but not the differentiator. It is important to understand that the decrease of the cut-off frequency is preferably effectuated gradually over a period of time in order to avoid configuration transients. The part of the filter control 13 that controls the gradual decrease of the DC-gain is referred to as 13a (FIG. 10), and the part of the filter control 13 that controls the gradual decrease of the cut-off frequency is referred to as 13b (FIG. 10).

Figure 11A:
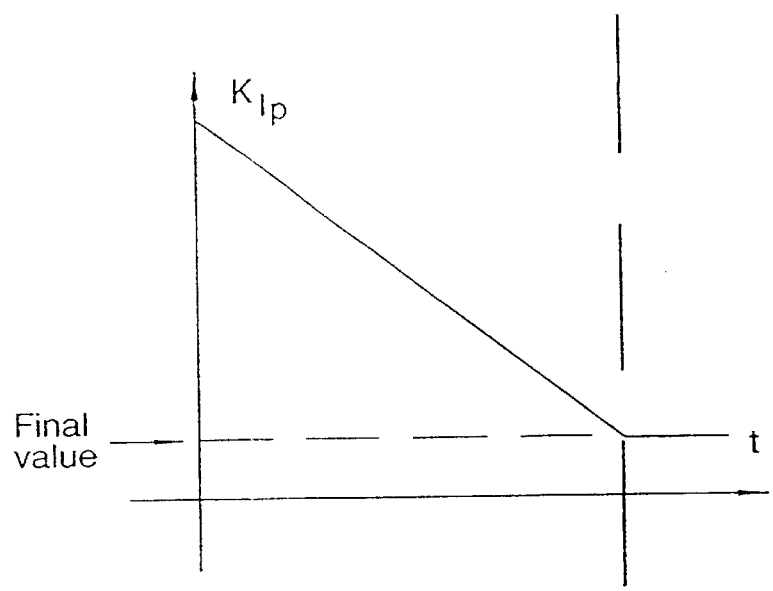
FIG. 11a is a schematic diagram showing the DC-gain of the digital low-pass filter as a function of time.
Figure 11B:
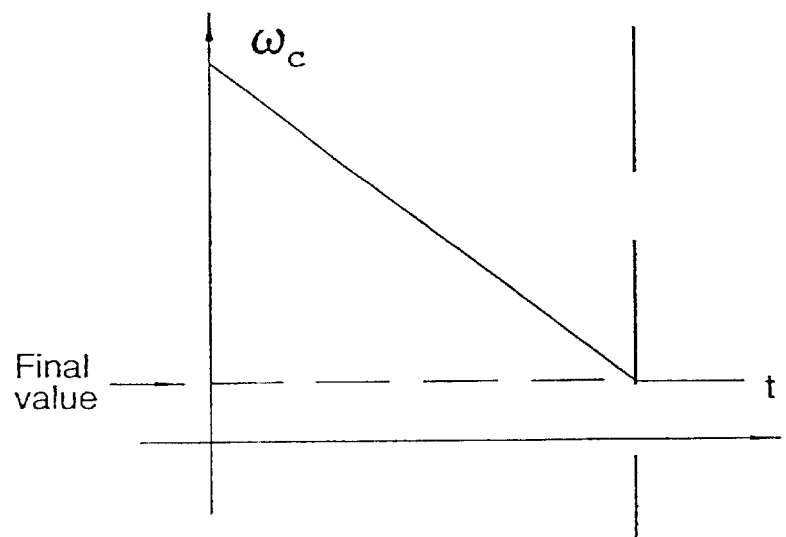
FIG. 11b is a schematic diagram showing the cut-off frequency of the digital low-pass filter as a function of time.
Figure 11C:
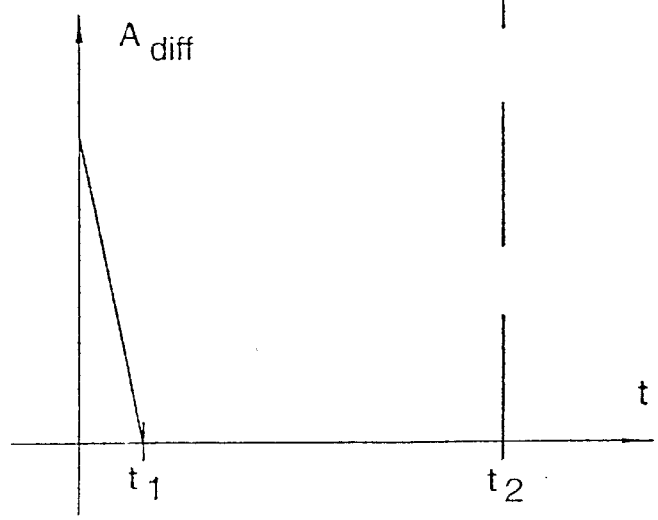
FIG. 11c is a schematic diagram showing the amplification for the differentiated signal as a function of time.

Consider the expressions (1) and (2) for the DC-gain of the digital low-pass filter and the cut-off frequency of the digital low-pass filter, respectively. By suitably changing the amplifications a and b, it is possible to alter the DC-gain and the cut-off frequency as desired, i.e. to gradually decrease the DC-gain and the cut-off frequency from a respective relatively high level at beginning of the lock-in to a respective lower level over selectable periods of time. FIG. 11a–c are schematic diagrams illustrating how the filter circuit parameters, in one embodiment of the invention, change in time. In FIG. 11a the DC-gain ($K_{1p}$) of the digital low-pass filter as a function of time (t) is shown. FIG. 11b shows the cut-off frequency ($\omega_c$) of the digital low-pass filter as a function of time (t), and FIG. 11c shows the amplification ($A_{diff}$) for the differentiated signal as a function of time (t). From these diagrams it can be seen that the respective filter circuit parameters are gradually decreased from relatively large values to smaller values over respective periods of time. Note that the respective initial values and the respective final values of the filter circuit parameters, as well as the respective time periods, are selectable and set to appropriate values as desired depending upon the particular application. It has turned out to be effective to gradually decrease the amplification for the differentiated signal to zero in a relatively short period of time. In general, the amplification reaches a zero value at a time $t_1$ long before the PLL enters steady state. At the very beginning of the lock-in the focus of the regulation is preferably on frequency locking, and some time before the time $t_1$, depending on the actual amplifications used, and thereinafter, the focus will be on phase locking. The frequency offset between the reference signal and the loop output signal is generally eliminated almost instantly by the effect of the differentiated signal on the output signal of the digital low-pass filter 6D, although the respective values of the DC-gain and the cut-off frequency have not been decreased to their final values. The DC-gain and the cut-off frequency are controlled by the filter control 13, and in the particular application shown in FIG. 11a–b they are decreased to their final values at a time $t_2$. As can be seen by using the broken line in FIG. 11a–c as a guidance, the time $t_2$ generally occurs later than time $t_1$. Experiments have shown that the phase difference between the two signals reaches a level very close to a minimum long before the DC-gain and the cut-off frequency have reached their respective final values, but generally after the time $t_1$. The respective final values for the cut-off frequency and the DC-gain are selected so as to provide stability and low output phase jitter at steady state, but also so that remaining static phase errors are reduced to a desired level. Note, that if the cut-off frequency of the digital low-pass filter is very close to zero, then the low-pass filter will act as an "ideal" integrator. In one embodiment of the invention, both the DC-gain and the cut-off frequency of the digital low-pass filter are decreased, in combination with the differentiator/low-pass filter arrangement.

Figure 12:
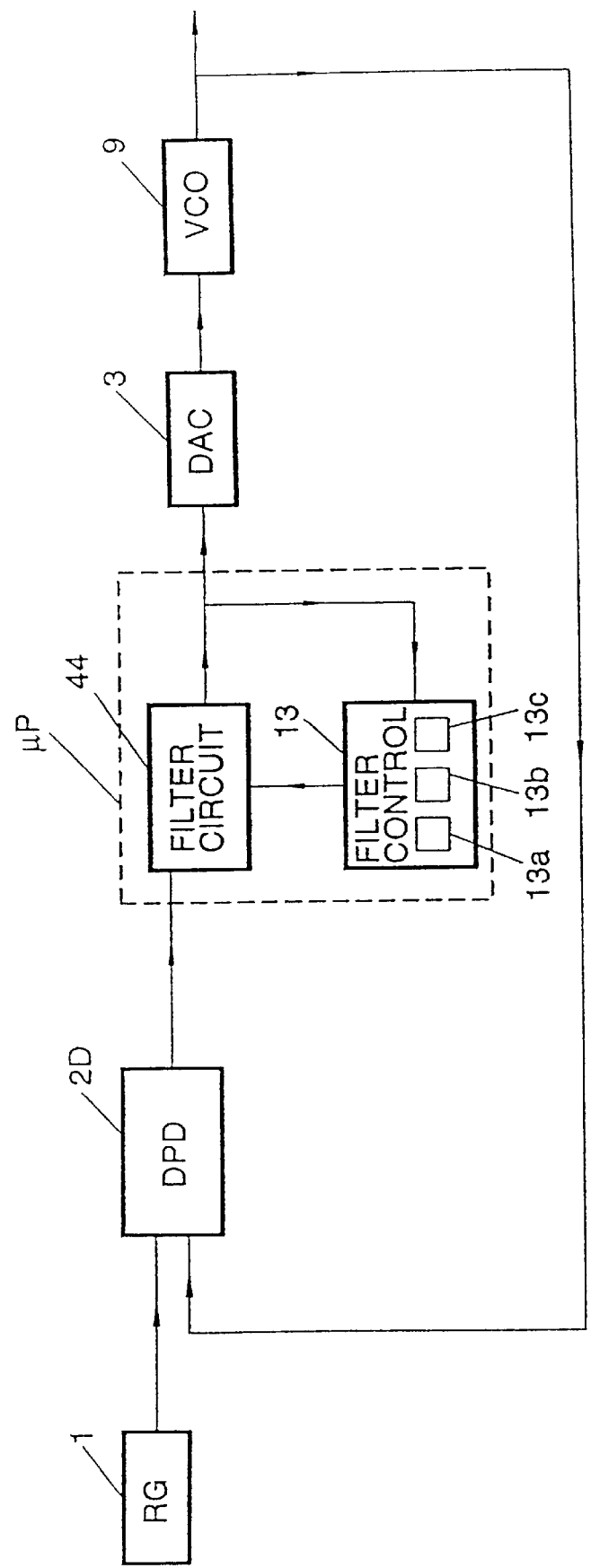
FIG. 12 is a schematic block diagram of a phase-locked loop according to the present invention.
Figure 13:
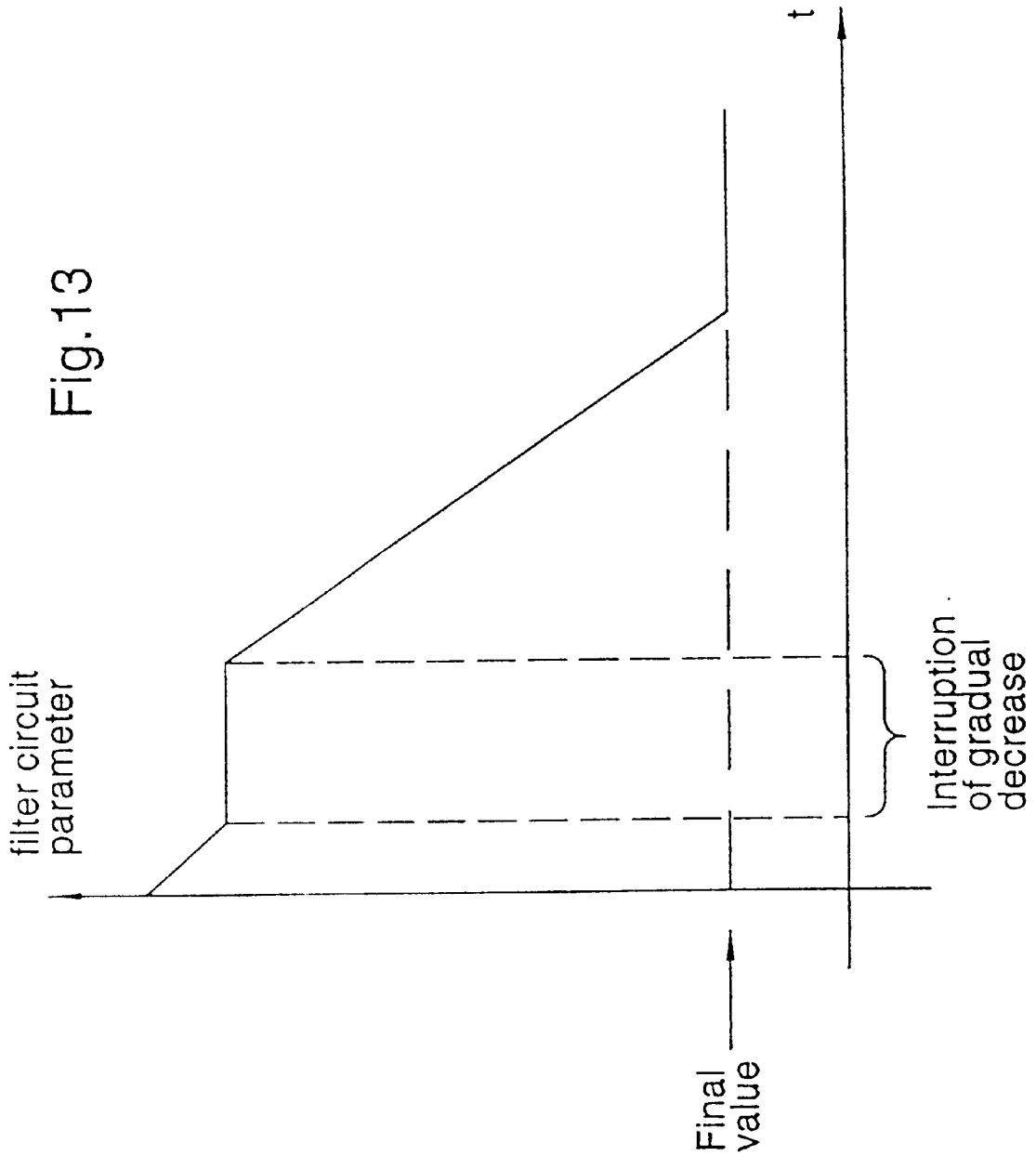
FIG. 13 is a schematic timing diagram illustrating a filter circuit parameter as a function of time when the gradual decrease of the parameter is temporarily interrupted.

FIG. 12 is a schematic block diagram similar to that of FIG. 10 showing a phase-locked loop in accordance with the invention. The phase-locked loop illustrated in FIG. 12 is identical to that of FIG. 10 except for a feedback from the output of the digital filter circuit 44 to the filter control 13. If the output signal from the digital filter circuit 44 corresponds to a voltage that is beyond the operating range or control range of the DAC 3 and/or the VCO 9, then the DAC 3 and/or the VCO 9 will be saturated in either direction. This may represent two different cases: first, a case in which the PLL is unable to synchronize with the reference signal; second, a case in which the frequency of the PLL output signal is far away from the target or reference frequency, but in which it is still possible to regulate the PLL in direction towards the reference frequency. In the latter case, it is important not to decrease the parameters of the digital filter circuit 44 as long as saturation remains. Otherwise, the parameters will be decreased to low values before the "real" lock-in of the PLL has started, and the effect of having large values on these filter parameters at the beginning of the actual lock-in to speed up the acquisition will be lost. If the VCO is tuned to its limits, the PLL-system is prohibited to drive the phase and frequency as much as it would do in the linear range. The large filter parameter values are needed when the PLL-system re-enters the non-saturated range. Accordingly, a feedback is provided for supplying the output signal of the digital filter circuit 44 to the filter control 13. The fitter control 13 receives the output signal from the digital filter circuit 44 and checks whether or not the voltage corresponding to the output signal from the digital filter circuit 44 lies within a predetermined portion of the control voltage range of the DAC 3 and/or the VCO 9. If the output signal of the filter circuit 44 lies outside the predetermined range, then the gradual decrease of at least one of the parameters of the digital filter circuit 44 is temporarily interrupted, and the respective parameter value(s) is/are held constant. In other words, at least one of the processes of gradually decreasing is interrupted when the DAC 3 and/or the VCO 9 are/is saturated. As soon as the filter circuit output signal lies within the predetermined range, the gradual decrease of the respective filter parameter(s) is resumed or continued. By filter circuit parameter is meant any one or the following parameters: the DC-gain of the low-pass filter 6D, the cut-off frequency of the low-pass filter 6D, and the differentiator amplification (in this embodiment, the amplification control 12 is integrated into the filter control 13). FIG. 13 is a schematic timing diagram illustrating a filter circuit parameter, such as $K_{1p}$, $\omega_c$ or $A_{diff}$, as a function of time when the gradual decrease of the parameter is temporarily interrupted. Note that, in general, $A_{diff}$ is decreased to zero. In one embodiment, the digital filter circuit 44 and the filter control 13 are software implemented, and the whole procedure executes in a microprocessor. Preferably, the digital filter circuit 44 is any one of the filter circuits 4D and 4D'. The part of the filter control 13 that controls the interruption and continuation of the gradual decrease of filter parameters is referred to as 13c. In an alternative embodiment, a similar control procedure can be carried out by checking the output signal, after suitable signal conversion, from the DAC 3. Naturally, the, above described interruption and continuation of the gradual decrease of filter parameters can be applied to any suitable digital filter circuit known to the art, with or without a differentiator connected to the filter. In one particular embodiment, the gradual decrease of the cut-off frequency of a filter in a phase-locked loop which does not have a differentiator arrangement is controlled in the manner described above. Experiments have shown that an effective acquisition is obtained also in this embodiment.

Mainly depending on the expected behaviour of the reference signal, the best performance of the PLL according to the invention is obtained by using any one of the filter circuits described above together with different combinations of the following means, all of which have been described in detail above:

means for gradually decreasing the signal contribution from the differentiator;

means for gradually decreasing the DC-gain of the filter from a relatively large value at the beginning of the lock-in to a smaller value;

means for gradually decreasing the cut-off frequency of the filter from a relatively large value at the beginning of the lock-in to a smaller value;

means for controlling the gradual decrease of at least one of the following:

the signal contribution from the differentiator, the DC-gain of the filter, and
the cut-off frequency of the filter; and
means for limiting the output signal as well as an internal feedback signal of the filter.

An exemplary embodiment of the invention will now be described with reference to FIG. 14.

Figure 14:
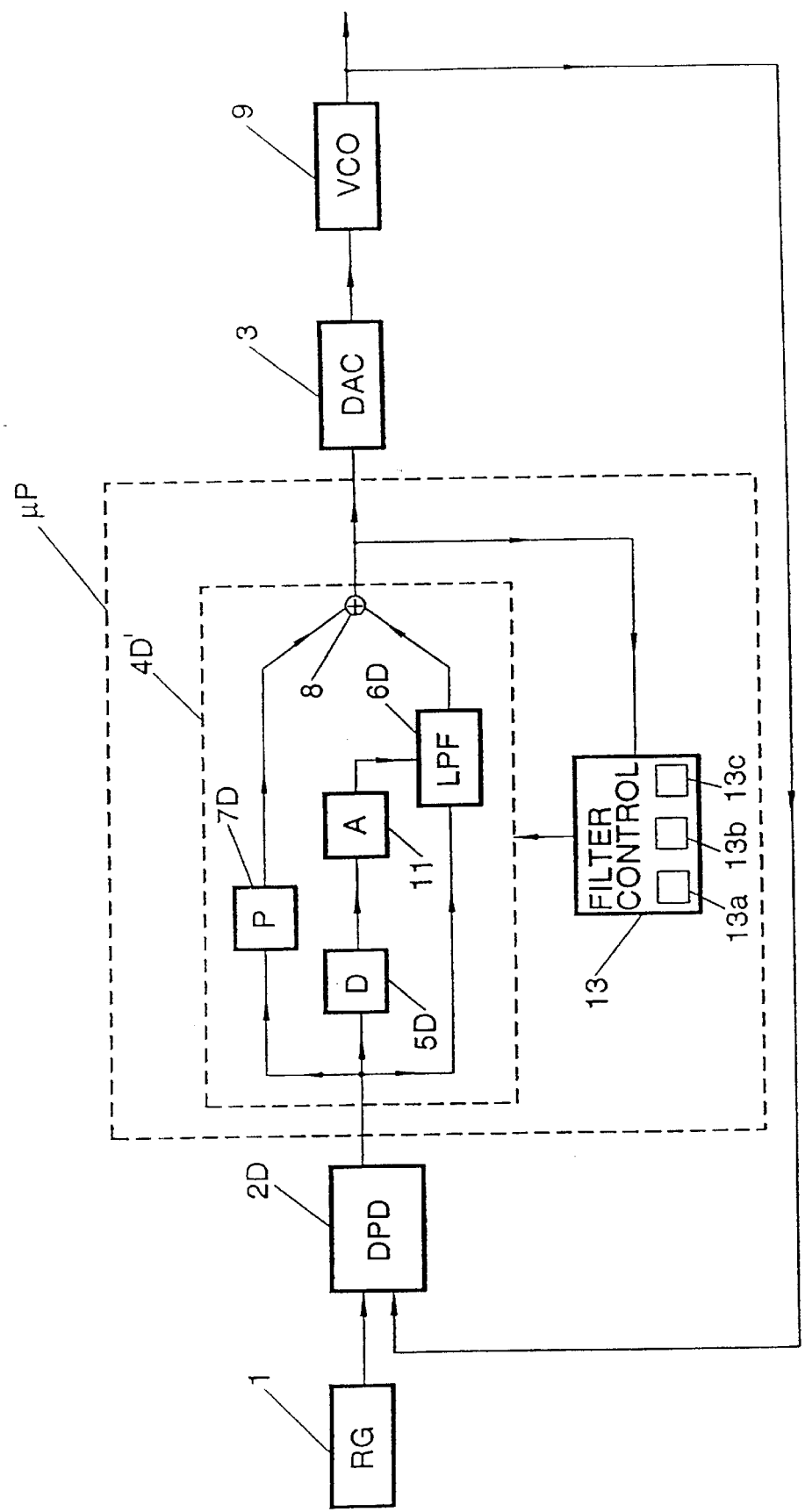
FIG. 14 is a schematic block diagram of a phase-locked loop according to an exemplary embodiment of the present invention.

FIG. 14 is a schematic block diagram of a phase-locked loop in accordance with an exemplary embodiment of the present invention when applied to clock regeneration in a telecommunication switch. Basically, there are general means 1, for generating a reference signal, a digital phase detector 2D, a digital filter circuit 4D', a digital-to-analog converter DAC 3, a VCO 9, a filter control 13, a feedback circuit from the output of the VCO 9 to an input of the digital phase detector 2D, and a further feedback from the output of the digital filter circuit 4D' to the filter control 13. In many applications, the reference and loop output signals are square wave clock signals. The digital phase detector 2D receives the reference signal and the loop output signal, i.e. the feedback signal from the VCO 9, to produce a digital error signal representative of a quantized phase difference between the two signals. Generally, it is assumed that initially there is a frequency offset and a phase difference between the two signals. The digital filter circuit 4D' receives the digital error signal to produce a digital control signal, which in turn is converted by the DAC 3 into an analog control signal. The analog control signal from the DAC 3 is sent to the VCO 9 for controlling the frequency of the output signal therefrom. The digital filter circuit 4D' includes the differentiator 5D, the amplifier 11, the digital low-pass filter 6D, the proportionally amplifying block 7D and the summing block 8D. The differentiator 5D receives the digital error signal from the digital phase detector 2D to produce a differentiated signal which in turn is amplified by the amplifier 11. The amplified differentiated signal is sent into the digital low-pass filter 6D, which also receives the digital error signal. The internal structure of the digital low-pass filter is best appreciated by reading the description referring to FIG. 9. However, note that there is provided a limiter which limits the output signal and the internal feedback signal of the digital low-pass filter 6D. The digital error signal is also sent to the proportionally amplifying block 7D which produces a proportionally amplified signal. The output signal of the digital low-pass filter 6D is added together with the proportionally amplified signal in the summing block 8D to provide the digital control signal. The amplification of the amplifying block 7D is relatively low compared with the DC-gain of the digital low-pass filter 6D. The filter control 13 controls the characteristics of the digital filter circuit 4D'. Preferably, the amplification control 12 is integrated into the filter control 13. Thus, the filter control 13 is used to gradually decrease the amplification of the amplifier 11 from a predetermined value to zero over a first period of time, a few samples, so as to achieve an effective acquisition, and to handle quantization distorsion. Furthermore, the DC-gain and the cut-off frequency of the digital low-pass filter 6D are also gradually decreased over a second and third period of time, respectively. The DC-gain at the beginning of the lock-in process is preferably 10–30 times larger than the final value, in this particular embodiment of the invention. The cut-off frequency at the beginning of lock-in is preferably 10–100 times larger than the final value. The steady state value of the cut-off frequency should be rather low for reasons of stability. Preferably, the first period of time is much shorter than the second and third periods of time. The DAC 3 receives the digital control signal and produces an analog control signal, which is sent to the VCO 9. The digital control signal from the filter circuit 4D' is also sent to the filter control 13, which interrupts the gradual decrease of at least one of the filter circuit parameters mentioned above when the digital control signal lies outside a predetermined range, and continues or resumes the gradual decrease when the digital control signal lies within the predetermined range. According to an exemplary embodiment of the invention, the gradual decrease of all three filter parameters is controlled by the filter control 13. The digital filter circuit 4D' and the filter control 13 incorporating the amplification control 12 are software based and executes in a microprocessor.

The interruption and continuation of the gradual decrease of filter parameters, and the limiter in the digital low-pass filter has turned out to be particularly effective when there are large frequency offsets between the reference signal and the loop output signal, although the differentiator gives the main contribution to a fast acquisition. In general, the differentiator/low-pass filter arrangement is very effective when encountering large frequency offsets. Moreover, the gradual decrease of the DC-gain from a rather high value in the beginning of the lock-in to a suitable and lower value at some time later and at steady state will further reduce the lock-in time. However, the DC-gain of the low-pass filter should not be too high, since although frequency locking is fast, the phase locking may turn oscillative. The DC-gain as well as other settings of the PLL must be adapted to the expected magnitude of the frequency offsets and/or phase jumps.

The embodiments described above are merely given as examples, and it should be understood that the present invention is not limited thereto. It is of course possible to embody the invention in specific forms other than those described without departing from the spirit of the invention. By way of example, the filter to be accelerated by the differentiator can be any one of a number of suitable filters known to the art (note that an ideal integrator is considered as a special case of a low-pass filter, since the cut-off frequency of the latter can be infinitesimally close to zero). Further modifications and improvements which retain the basic underlying principles disclosed and claimed herein are within the scope and spirit of the invention.

What is claimed is:

1. Phase-locked loop arrangement for synchronizing an output signal of said phase-locked loop with an input reference signal, comprising:
   an output signal source for providing said output signal in response to a control signal, said output signal having a frequency that is dependent upon said control signal;
   phase detector means responsive to said input reference signal and said output signal for providing an error signal representative of the difference in phase between said input reference signal and said output signal;
   first feedback means connected from the output of the output signal source to an input of said phase detector means for applying, said output signal to said phase detector means;
   differentiating means responsive to said error signal for providing a differentiated signal representative of a discrete-time approximation of the time-derivative of said error signal;
   digital filter means responsive to said error signal and said differentiated signal for providing a digital control signal;
   a digital-to-analog converter responsive to said digital control signal for converting said digital control signal into said control signal; and means for controlling the signal contribution from said differentiating means such that lock-acquisition is performed in two different phases, a first initial frequency-locking phase at the beginning of lock-acquisition and a second main phase-locking phase, wherein said control signal means includes first means for gradually decreasing the signal contribution from said differentiating means from a first relatively high value to a second lower value during said first initial frequency-locking phase so that focus of the regulation is shifted from frequency locking to phase locking.

2. Phase-locked loop arrangement in accordance with claim 1, wherein said first relatively high value is applied at the beginning of the lock-in of the PLL, and said first initial frequency-locking phase is relatively short such that said second lower value, which preferably is zero, is reached before the PLL reaches steady-state.

3. Phase-locked loop arrangement in accordance with claim 1, wherein said first means for gradually decreasing the signal contribution from said differentiating means comprises:

first amplifying means for amplifying said differentiated signal, said digital filter means being responsive to both said error signal and said amplified differentiated signal; and second means for gradually decreasing the amplification of said first amplifying means from a third value to a fourth value.

4. Phase-locked loop arrangement in accordance with claim 1, further comprising:

second amplifying means responsive to said error signal for providing a second amplified signal, and first summing means responsive to said second amplified signal and the output signal of said digital filter means to provide said digital control signal.

5. Phase-locked loop arrangement in accordance with claim 1, further comprising third means for gradually decreasing the DC-gain of said digital filter means from a fifth value to a sixth value over a second period of time.

6. Phase-locked loop arrangement in accordance with claim 1, wherein said phase-locked loop arrangement further comprises fourth means for gradually decreasing the cut-off frequency of said digital filter means from a seventh value to an eighth value over a third period of time.

7. Phase-locked loop arrangement in accordance with claim 3, wherein said third value, generally greater than 1, is substantially greater than said fourth value.

8. Phase-locked loop arrangement in accordance with claim 6, wherein said seventh value is substantially greater than said eighth value.

9. Phase-locked loop arrangement in accordance with claim 5, wherein said first initial frequency-locking phase is shorter than said second period of time.

10. Phase-locked loop arrangement in accordance with claim 6, wherein said first initial frequency-locking phase is shorter than said third period of time.

11. Phase-locked loop arrangement in accordance with claim 1 further comprising:

control means for controlling said first means for gradually decreasing so that the gradual decrease is temporarily interrupted when said digital control signal lies outside a first predetermined range, and so that the gradual decrease is resumed when said digital control signal lies within said first predetermined range, and second feedback means for providing said digital control signal to said control means.

12. Phase-locked loop arrangement in accordance with claim 3, wherein said digital filter means includes:

third amplifying means responsive to said error signal for providing a third amplified signal;

second summing means responsive to said third amplified signal and an amplified delayed internal feedback signal of said digital filter means to provide the output signal of said digital filter means, also acting as an internal feedback signal;

delay means for delaying said internal feedback signal;

third feedback means for providing said internal feedback signal to said delay means; and fourth amplifying means responsive to said delayed internal feedback signal for providing said amplified delayed internal feedback signal to said second summing means, wherein said second summing means also is responsive to said amplified differentiated signal for adding said amplified differentiated signal, said third amplified signal and said amplified delayed internal feedback signal to provide the output signal of said digital filter means.

13. Phase-locked loop arrangement in accordance with claim 12, wherein said digital filter means further comprises means for limiting the output signal of said digital filter means as well as the internal feedback signal of said digital filter means to both lie within a second predetermined range.

14. Phase-locked loop arrangement in accordance with claim 3, further comprising control means for controlling said second means for gradually decreasing so that the gradual decrease is temporarily interrupted when said digital control signal lies outside a first predetermined range, and so that the gradual decrease is resumed when said digital control signal lies within said first predetermined range, and second feedback means for providing said digital control signal to said control means.

15. Phase-locked loop arrangement is accordance with claim 5, further comprising control means for controlling said third means for gradually decreasing so that the gradual decrease is temporarily interrupted when said digital control signal lies outside a first predetermined range, and so that the gradual decrease is resumed when said digital control signal lies with in said first predetermined range, and second feedback means for providing said digital control signal to said control means.

16. Phase-locked loop arrangement is accordance with claim 6, further comprising control means for controlling said fourth means for gradually decreasing so that the gradual decrease is temporarily interrupted when said digital control signal lies outside a first predetermined range, and so that the gradual decrease is resumed when said digital control signal lies within said first predetermined range, and second feedback means for providing said digital control signal to said control means.

17. Phase-locked loop arrangement for synchronizing an output signal of said phase-locked loop with an input reference signal, comprising:

an output signal source for providing said output signal in response to a control signal, said output signal having a frequency that is dependent upon said control signal;

phase detector means responsive to said input reference signal and said output signal for providing an error signal representative of the difference in phase between said input reference signal and said output signal;

first feedback means connected from the output of the output signal source to an input of said phase detector means for applying said output signal to said phase detector means;

digital filter means responsive to said error signal for providing a digital control signal;

a digital-to-analog converter responsive to said digital control signal for converting said digital control signal into said control signal; and means for gradually decreasing the DC-gain of said digital filter means from a first value to a second value over a period of time.

18. Phase-locked loop arrangement for synchronizing an output signal of said phase-locked loop with an input reference signal, comprising:

an output signal source for providing said output signal in response to a control signal, said output signal having a frequency that is dependent upon said control signal;

phase detector means responsive to said input reference signal and said output signal for providing an error signal representative of the difference in phase between said input reference signal and said output signal;

first feedback means connected from the output of the output signal source to an input of said phase detector means for applying said output signal to said phase detector means;

digital filter means responsive to said error signal for providing a digital control signal;

means for gradually decreasing at least one filter parameter associated wit h said digital filter means;

a digital-to-analog converter responsive to said digital control signal for converting said digital control signal into said control signal, control means for controlling said means for gradually decreasing said at least one filter parameter so that the gradual decrease is temporarily interrupted when said digital control signal or said control signal ties outside a first predetermined range, and so that the gradual decrease is resumed when said digital control signal or said control signal lies within said first predetermined range, and second feedback means for providing said digital control signal or said control signal to said control means.

19. Phase-locked loop arrangement in accordance with claim 18, wherein said at least one filter parameter is selected from the group of a cut-off frequency and a DC-gain.

20. Phase-locked loop arrangement in accordance with claim 18, wherein said digital filter means includes a digital low-pass filter and said at least one filter parameter is the cut-off frequency and/or DC-gain of said digital low-pass filter.

21. Phase-locked loop arrangement in accordance with claim 18, wherein said first predetermined range corresponds to a predetermined portion of the control range of said digital-to-analog converter or said output signal source.

22. Phase-locked loop arrangement in accordance with claim 18, wherein said digital filter means includes:

a differentiator responsive to said error signal for providing a differentiated signal representative of a discrete time approximation of the time-derivative of said error signal;

first amplifying means for amplifying said differentiated signal; and a digital filter responsive to both said error signal and said amplified differentiated signal to provide said digital control signal, said at least one filter parameter being the amplification of said first amplifying means.

23. Phase-locked loop arrangement in accordance with claim 18, wherein said at least one filter parameter is gradually decreased from a relatively high value at the beginning of the synchronization to a smaller value over a predetermined period of time.

24. Method for synchronizing an output signal of a phase-locked loop arrangement with an input reference signal comprising the steps of detecting the phase difference between said output signal and said reference signal to provide an error signal representative of said phase difference;

differentiating said error signal to provide a differentiated signal; and filtering said error signal in digital filter means to provide a digital control signal;

sending said differentiated signal into said digital filter means to contribute to said digital control signal;

converting said digital control signal into a control signal;

controlling the output signal in response to said control signal; and performing lock-acquisition in two different phases, a first initial frequency locking phase at the beginning of lock-acquisition and a second main phase-locking phase, wherein said step of performing lock-acquisition in two different phases includes the step of gradually decreasing the contribution of said differentiated signal to said digital control signal from a first relatively high level to a second lower level during said first initial frequency-locking phase so that focus of the regulation is shifted from frequency locking to phase locking.

25. Method in accordance with claim 24, further comprising at least one of the following steps:

gradually decreasing the DC-gain of said digital filter means from a third level to a fourth level over a second period of time;

gradually decreasing the cut-off frequency of said digital filter means from a fifth level to a sixth level over a third period of time; and limiting the output signal of said digital filter means as well as an internal feedback signal of said digital filter means to both lie within a second predetermined range.

26. Method in accordance with claim 25, further comprising the steps of:

interrupting at least one of said steps of gradually decreasing when said digital control signal lies outside a first predetermined range; and resuming the respective one(s) of said at least one of said steps of gradually decreasing when said digital control signal lies within said first predetermined range.

27. Method for synchronizing an output signal of a phase-locked loop arrangement with an input reference signal comprising the steps of:

detecting the phase difference between said output signal and said reference signal to provide an error signal representative of said phase difference;

filtering said error signal in a digital filter to provide a digital control signal;

gradually decreasing at least one filter parameter of said digital filter;

converting said digital control signal into a control signal;

controlling the output signal in response to said control signal;

interrupting said step of gradually decreasing when said digital control signal or said control signal lies outside a first predetermined range; and resuming said step of gradually decreasing when said digital control signal or said control signal lies within said first predetermined range.

28. Method in accordance with claim 27, wherein said at least one filter parameter is selected from the group of: a cut-off frequency and a DC-gain.

29. Method in accordance with claim 27, wherein said digital filter includes a digital low-pass filter and said at least one filter parameter is the cut-off frequency and/or DC-gain of said digital low-pass filter.

30. Method in accordance with claim 27, wherein said at least one filter parameter is a gain factor associated with an amplification of a differentiation of said error signal, the amplified differentiated error signal contributing to said digital control signal.

31. Method in accordance with claim 27, wherein said at least one filter parameter is gradually decreased from a relatively high value at the beginning of the synchronization to a smaller value over a predetermined period of time.

* * * * *

UNITED STATES PATENT AND TRADEMARK OFFICE
CERTIFICATE OF CORRECTION

PATENT NO. : 6,353,647 B1
DATED : March 5, 2002
INVENTOR(S) : Mats Wilhelmsson et al.

It is certified that error appears in the above-identified patent and that said Letters Patent is hereby corrected as shown below:

Column 15,
Lines 5-6, "Said control signal means" should read -- said controlling means --.

Signed and Sealed this

Second Day of July, 2002

Attest:

JAMES E. ROGAN
Attesting Officer     Director of the United States Patent and Trademark Office